United States Patent [19]
Wen et al.

[11] Patent Number: 5,708,283
[45] Date of Patent: Jan. 13, 1998

[54] FLIP CHIP HIGH POWER MONOLITHIC INTEGRATED CIRCUIT THERMAL BUMPS

[75] Inventors: Cheng P. Wen, Mission Viejo; Wah S. Wong, Montebello; William D. Gray, Redondo Beach, all of Calif.

[73] Assignee: Hughes Aircraft, Los Angeles, Calif.

[21] Appl. No.: 771,458

[22] Filed: Dec. 20, 1996

Related U.S. Application Data

[63] Continuation of Ser. No. 606,662, Feb. 26, 1996, abandoned, which is a continuation of Ser. No. 326,292, Oct. 20, 1994, abandoned.

[51] Int. Cl.$^6$ .................................................. H01L 23/367
[52] U.S. Cl. ........................... 257/276; 257/706; 257/522; 257/778
[58] Field of Search .................................. 257/777, 778, 257/780, 737, 738, 522, 625, 705, 706, 707, 276, 277

[56] References Cited

U.S. PATENT DOCUMENTS

| | | | |
|---|---|---|---|
| 4,845,542 | 7/1989 | Bezuk et al. ............................. | 257/737 |
| 4,912,545 | 3/1990 | Go ............................................ | 257/737 |
| 4,917,466 | 4/1990 | Nakamura et al. ...................... | 350/336 |
| 4,959,705 | 9/1990 | Lemnios et al. ......................... | 257/522 |
| 5,168,329 | 12/1992 | Shiga ...................................... | 257/522 |
| 5,319,237 | 6/1994 | Legros .................................... | 257/778 |
| 5,345,106 | 9/1994 | Doering et al. ......................... | 257/707 |
| 5,349,239 | 9/1994 | Sato ........................................ | 257/737 |
| 5,350,947 | 9/1994 | Takekawa et al. ...................... | 257/737 |
| 5,352,926 | 10/1994 | Andrews ................................. | 257/737 |
| 5,376,584 | 12/1994 | Agarwala ................................ | 257/737 |
| 5,424,693 | 6/1995 | Lin .......................................... | 333/33 |
| 5,506,755 | 4/1996 | Miyagi et al. . | |

FOREIGN PATENT DOCUMENTS

| | | | |
|---|---|---|---|
| 0405660 | 1/1991 | European Pat. Off. . | |
| 0598555 | 5/1994 | European Pat. Off. . | |
| 0252471 | 12/1987 | Germany ................................ | 257/737 |
| 0174731 | 7/1991 | Japan ...................................... | 257/737 |
| 0225542 | 8/1992 | Japan ...................................... | 257/737 |

OTHER PUBLICATIONS

IBM Technical Disclosure Bulletin, vol. 35, No. 3, Aug. 1992, New York, pp. 29–30.

Patent Abstracts of Japan, vol. 015, No. 465 (E–1138), Nov. 26, 1991 & JP–A–03 201701, 3 Sep. 1991.

IBM Technical Disclosure Bulletin (vol. 13, No. 2, Jul. 1970) p. 510.

*Primary Examiner*—Wael Fahmy
*Assistant Examiner*—David B. Hardy
*Attorney, Agent, or Firm*—M. E. Lachman; M. W. Sales; W. K. Denson-Low

[57] ABSTRACT

A high power, flip-chip microwave monolithic integrated circuit (MMIC) assembly (30) has a high power microwave monolithic integrated circuit (MMIC) having a surface with an active area (72) in which heat is generated. The assembly also has a host substrate (34). A thermally conductive bump (51) formed over the surface of the MMIC has a first portion (51') in close proximity to and in thermal communication with the active area (72) of the MMIC and a second portion (51") which is in close proximity to and in thermal communication with the host substrate (34). The second portion (51") of the thermal bump (51) has a greater cross-sectional area than the first portion (51'). A multi-layer, multi-exposure method of manufacturing the improved thermal bump (51) includes several steps. A plating membrane (80) is formed on a surface of the MMIC (32). A first layer of negative photoresist is applied to the surface of the plating membrane (80), and is exposed with a first masked pattern of light. A second layer of negative photoresist is applied on top of the first layer of photoresist. The second layer of negative photoresist is exposed with a second masked pattern of light. Unexposed areas of the first and second layers of photoresist form a "T" shape. The first and second layers of photoresist are developed with a photoresist developer, thereby leaving a "T"-shaped via in the photoresist. An electrically and thermally conductive metal is plated onto the plating membrane and into the via to form a substantially "T"-shaped bump (51), which is then attached to a host substrate. The resulting bump has greater cross-sectional area at the host substrate than at the MMIC (32).

7 Claims, 3 Drawing Sheets

FLIP CHIP HIGH POWER MONOLITHIC INTEGRATED CIRCUIT THERMAL BUMPS

This is a continuation application Ser. No. 08/606,662, filed Feb. 26, 1996, now abandoned, which is a continuation of Ser. No. 08/326,292 filed Oct. 20, 1994, now abandoned.

FIELD OF THE INVENTION

The present invention relates to high power, flip-chip microwave monolithic integrated circuit (MMIC) modules having thermally conductive bumps to carry heat from the integrated circuit to the module substrate, and more particularly to bumps that are shaped to improve thermal conductivity.

DESCRIPTION OF RELATED ART

Low thermal resistance paths are critical for optimum performance of high power or high efficiency electronic microwave devices such as field-effect transistors (FETs), high electron mobility transistors (HEMTs), and heterojunction bipolar transistors (HBTs). All of these devices generate energy in the form of heat due to resistive parasitics and losses in the devices themselves. As the temperature of the device increases, the radio frequency (RF) performance degrades, and the device may even experience catastrophic failure due to self-heating. Consequently, heat must be taken from the device's active area in which the heat is generated and transferred elsewhere, such as to a module substrate.

One approach to dissipating such heat is illustrated in FIG. 1, which shows a conventional flip-chip mounted microwave monolithic integrated circuit (MMIC) assembly 30. The assembly includes a MMIC chip 32 which is flip-chip mounted on a host substrate 34. The chip 32 has a substrate-facing surface 36, whereas the substrate 34 has a chip-facing surface 38. The chip 32 is typically formed of 635 micrometer thick GaAs, whereas the substrate 34 is typically formed of beryllium oxide or alumina and may have any suitable thickness.

Active electronic devices 40 are formed on the substrate-facing surface 36 of the chip 32. The devices 40 may be similar or different, and formed by any suitable process such as ion implantation, epitaxy, etc. The devices 40 may be, for example, FETs, HEMTs, or HBTs, and have active areas 42 in which heat is generated during operation. Thermally conductive contacts or pads 44 are formed on the surface 36 in close proximity to the active areas 42, respectively. The pads 44 may also be electrically conductive, and constitute electrical contact pads for elements of the devices 40. For example, where the devices 40 are FETs connected in a common-source configuration, the pads 44 may be source contact pads of the devices 40.

Thermally conductive bumps 50 are formed on the pads 44 by deposition, electroplating, or any other suitable process. The bumps 50 are also preferably electrically conductive, and formed of a metal such as silver, gold or aluminum, two or more layers of such metals, or an alloy thereof. The bumps 50 must necessarily extend further away from the surface 36 than the devices 40 in order to provide an adequate spacing between the devices 40 and the surface 38. In a typical flip-chip MMIC configuration, the bumps 50 will be on the order of 75 micrometers thick. Also illustrated are additional electrically conductive bumps 52 formed on portions 54 of a ground plane of the chip 32 in a conventional manner to provide spacing and ground interconnection between the chip 32 and substrate 34.

The chip 32 is flip-chip mounted on the substrate 34 using a conventional reflow or other soldering process by which the bumps 50 are soldered and thereby electrically and thermally connected to metal pads (not shown) attached to the substrate, and the bumps 52 are similarly soldered to the ground plane portions 54, respectively. The bumps 50 conduct heat generated at the active areas 42 of the devices 40 to the substrate 34, thereby removing the heat from the devices 40 and the surrounding areas of the chip 32.

FIG. 2 shows a side section of a conventional thermal bump 50 taken at Line 2—2 of FIG. 1. The cross-section of conventional thermal bump 50 is substantially constant and does not substantially change in between the MMIC pad 44 and the substrate 34.

Unfortunately, common substrate dielectric materials such as alumina and low temperature cofired ceramics are poor thermal conductors, and often account for a large fraction of the total thermal resistance in the heat dissipating path of the flip chip mounted MMICs. This thermal resistance degrades thermal properties of the MMIC, thereby decreasing performance, reliability and compactness of packaging.

SUMMARY OF THE INVENTION

It is an object of the present invention to provide an improved thermal bump for thermally and electrically interconnecting active areas of a flip-chip MMIC with the module substrate. It is also an object of the present invention to provide an improved thermal bump which exhibits lower inductance qualities relative to prior art bumps. It is a further object of the present invention to provide a method of manufacturing improved thermal bumps for flip-chip, high power MMIC modules.

In carrying out principles of the present invention in accordance with a preferred embodiment thereof, an improved thermally conductive bump is provided for a flip-chip microwave monolithic integrated circuit (MMIC) module. The module includes a high power MMIC having a surface with an active area in which heat is generated during operation of the MMIC. The module also includes a host substrate, with the thermally conductive bump thermally interconnecting the MMIC with the host substrate. The thermally conductive bump is formed at the surface of an area of the MMIC of relatively higher temperature with a first portion of the bump in close proximity to and in thermal connection with the higher temperature area of the MMIC. The bump has a second portion which is in close proximity to and in thermal communication with the host substrate. The improved thermal bump is characterized in that the second portion of the bump has a greater cross-sectional area than the first portion of the bump. That is, the thermal bump has a larger footprint at the module substrate than it does at the MMIC.

Various additional features may be incorporated into embodiments of the present invention. The thermally conductive bump in one embodiment is substantially "T"-shaped in which the "T" has a cross-bar and a post. The cross-bar is juxtaposed to the host substrate, while the post portion of the "T" is connected to the active area of the MMIC. The cross-sectional area of the thermal bump at the substrate is at least approximately 1.5 times greater than the cross-sectional area of the thermal bump at the MMIC. The bump may be formed substantially of plated silver. The bump may also be soldered to the host substrate.

In accordance with various other features within the scope of the present invention, the active area of the MMIC may include a number of source pads, gate pads, drain pads, and electrically conductive air bridges. Air bridges may extend over the gate pads and drain pads, with the source pads interposed in between the air bridges. The thermally conductive bump may also be electrically conductive. The bump may be in electrical contact with the source pads and the air bridges, with the gate pads and drain pads being separated from the air bridges by free air spaces. The gate pads and drain pads may be free from electrical contact with the bump. The host substrate may serve as a common ground to the source pads. The bump may have a variety of shapes, so long as the bump has a larger cross-sectional area at its base than at its top, with the base being in thermal communication with the substrate and the top being in thermal communication with the MMIC. The flip chip MMIC module may also include a thin gold plating membrane which is interposed in between the first narrower portion of the bump and the MMIC. The layer of gold may have a thickness of between approximately 2,000 and 5,000 angstroms.

A multi-layer, multi-exposure method of manufacturing an improved thermally conductive, "T"-shaped thermal bump may have several steps. A plating membrane is formed on the connection pad of the MMIC. A first layer of negative photoresist is applied to the surface of the plating membrane. The first layer of negative photoresist is exposed with the first masked pattern of light, in which a first rectangular area of photoresist is left unexposed. A second layer of negative photoresist is applied on top of the first layer of photoresist. The second layer of negative photoresist is exposed to a second masked pattern of light which leaves a second rectangular unexposed portion of negative photoresist juxtaposed above the first rectangular unexposed portion. The second unexposed portion of photoresist, however, is wider than the first unexposed portion of photoresist. The first and second layers of photoresist are developed with a photoresist developer, thereby leaving a substantially "T"-shaped via in the photoresist. An electrically and thermally conductive metal is plated onto the plating membrane and into the substantially "T"-shaped via to form a substantially "T"-shaped bump.

Various embodiments of the present inventive method may include additional steps and/or refinements. The thermally conductive bump may be formed substantially of silver. The steps of applying the first and second layers of negative photoresist may further include applying the negative photoresist from a sheet of dry photoresist. The bump may also be soldered to the host substrate.

In one embodiment of the present method, a third layer of negative photoresist is applied on top of the second layer of photoresist. The third layer of photoresist is exposed with a third masked pattern of light leaving a third unexposed portion of negative photoresist which is wider than the first and second unexposed portions of photoresist. When three or more layers of photoresist are used, a variety of shapes may be constructed.

Other objects, features and advantages of the invention will become apparent from a consideration of the following detailed description and the accompanying drawings.

DETAILED DESCRIPTION OF PREFERRED EMBODIMENTS

Figure 1:
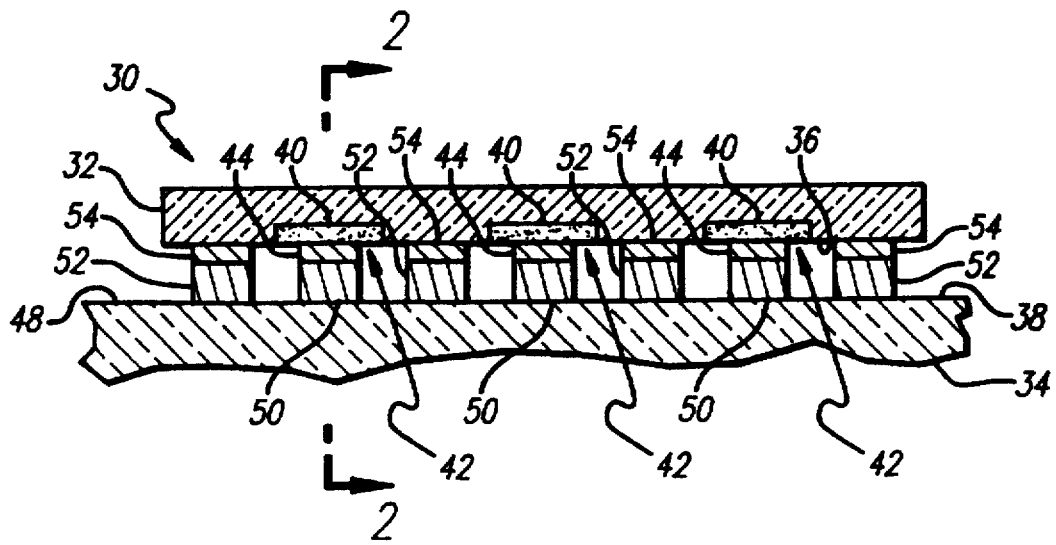
FIG. 1 is a simplified partial sectional view illustrating a flip-chip MMIC assembly of the prior art having conventional thermal bumps.
Figure 3:
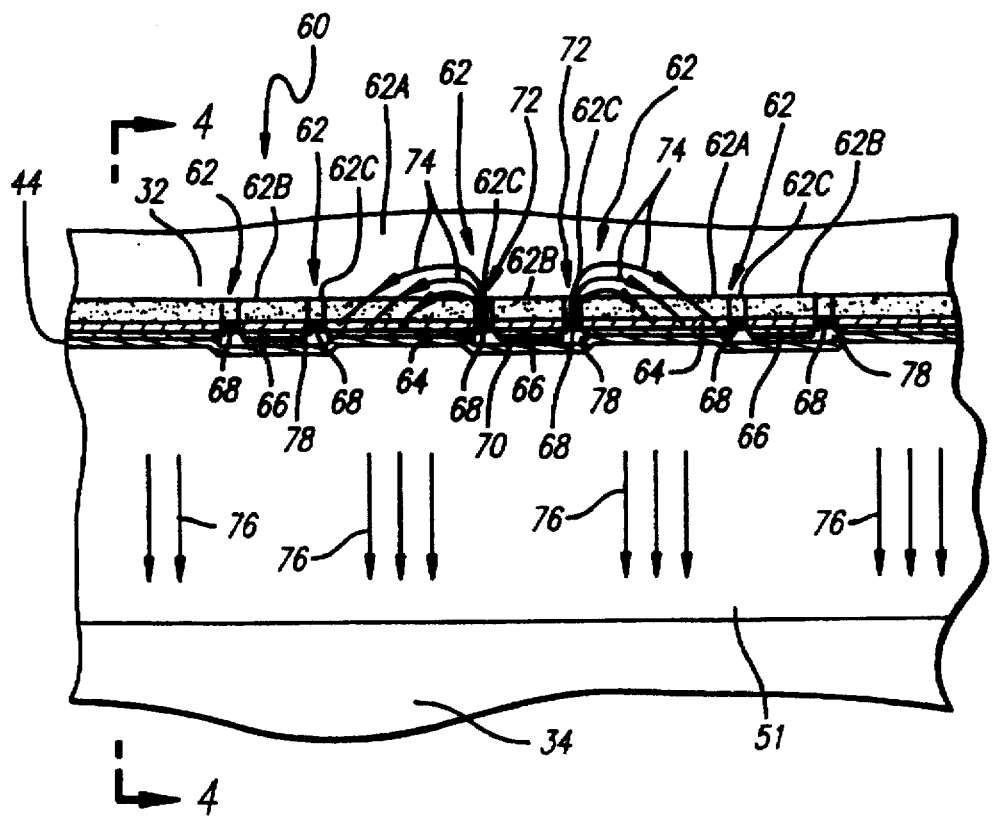
FIG. 3 is a simplified detail view of the active area of a MMIC with a bump according to the present invention, greatly enlarged, thermally interconnecting the MMIC with the module substrate.

FIG. 3 is a detailed view of the active area of a specific flip-chip MMIC assembly 60 in which the devices 40 shown in FIG. 1 are embodied by power field-effect transistors 62. Like elements are designated by the same reference numerals used in FIG. 1. Each transistor 62 includes a source 62A, drain 62B and channel 62C. The transistors 62 may be formed using conventional procedures such as ion implantation, epitaxy, or any other suitable process.

External connections for the transistors 62 are made by means of source pads 64, drain pads 66, and gate pads 68. The pads 64, 66 and 68 are formed of one or more layers of electrically conductive materials such as gold, silver, or aluminum on the surface 36 of the chip 32 in electrical connection with the respective source 62A, drain 62B and channel 62C, respectively. Although not visible in the drawing, gate insulating layers are formed between the gate pads 68 and channels 62C of the transistors 62. The source pads 64 are interconnected by an air bridge 70 such that the transistors 62 may be operated in a parallel source-follower configuration.

The transistors 62 generate maximum heat in active areas 72 constituted mainly by the portions of the channels 62C between the gate pads 68 and the drains 62B. These transistors are mounted on a typically ceramic substrate 34 by means of generally trapezoidal thermal bumps 51 each of which interconnect several adjacent transistors to substrate 34. As illustrated by arrows 74 and 76, heat generated during operation of the transistors 62 flows from the active areas 72 through a relatively short portion of the body of the chip 32, the source pads 64, the air bridge 70, and the bumps 51 (FIGS. 3 and 4) to the substrate 34.

In the source-follower configuration illustrated in FIG. 3, the source pads 64 are electrically interconnected by the air bridge 70, which is in turn electrically connected to the substrate. The bumps 51 therefore provide both heat sinking and electrical grounding functions. The bumps 51 are typically soldered to host substrate 34 with lead-indium solder using known soldering techniques.

As mentioned above, thermal dissipation through the low thermal conductivity substrate is related to the cross-sectional area of the thermal bump at the substrate. However, the cross-sectional area of the bump at the MMIC is limited by the size of the active areas 40 on the MMIC. Consequently, the conventional approach has been to limit the cross-sectional area of the entire bump to the area of the bump at the MMIC.

The present invention takes advantage of the fact that the thermal resistance of the substrate is a function of the cross-sectional area, or footprint, of the plated metal bumps at the substrate. That is, the amount of heat that is dissipated into the substrate increases as the cross-sectional area of the plated bumps at the substrate also increases. The thermal bumps of the present invention, having a limited area at the point of heat generation, are configured to have a larger heat transmitting area where they contact the high thermal resistance substrate.

Figure 2:
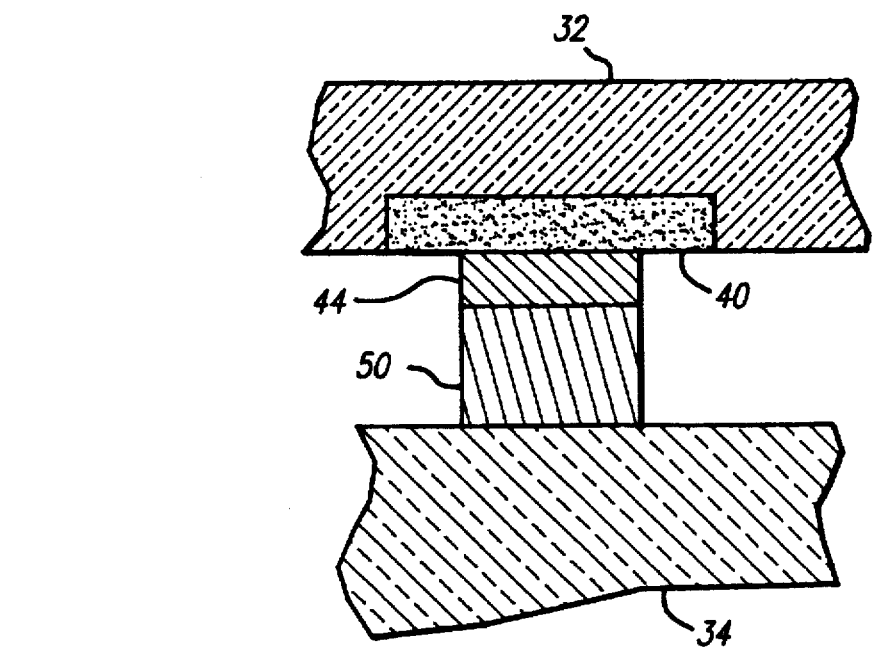
FIG. 2 is a partial side sectional view taken along Section 2—2 of FIG. 1 illustrating the profile of a conventional, constant cross-section thermal bump.
Figure 4:
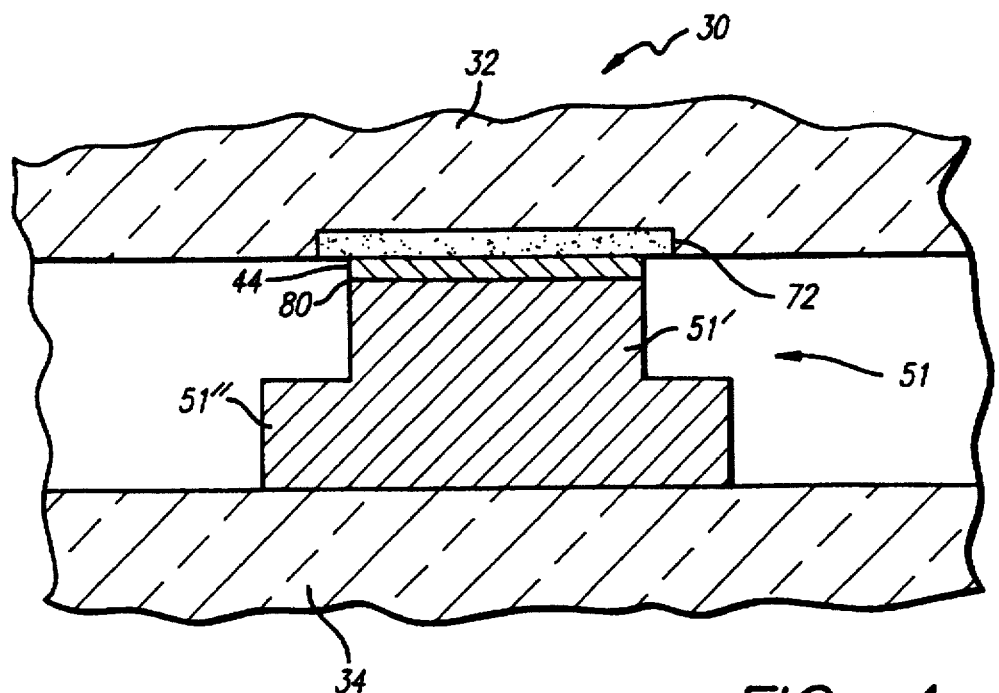
FIG. 4 is a partial side sectional view of an improved thermal bump taken along Section 4—4 of FIG. 3.

FIG. 4 is a greatly enlarged side sectional view of an improved thermal bump 51 having a substantially "T"-shaped side cross-section. Bump 51 has a smaller cross-sectional area portion 51', which may also be referred to as the post of the "T", in the proximity of and in thermal communication with the active heat-generating area 72 of MMIC 32. Bump 51 also has a larger cross-sectional area portion 51", which may also be referred to as the crossbar portion of the "T", in the proximity of and in thermal communication with heat dissipating host substrate 34. The "T" shape provides an increased cross-sectional area at the substrate without requiring an increase in the cross-sectional area at the MMIC. The increased cross-sectional area, or footprint, at the substrate reduces the thermal resistance of the substrate across the interface between the bump and the substrate and increases the amount of heat that is drained from the active area of the MMIC as compared to the conventional bump of FIG. 2.

It may be noted that the electrical inductance of conventional thermal bumps is generally considered to be an undesirable property within a high-performance electronic unit such as a MMIC module. However, the improved thermal bump of FIG. 4 has a lower electrical inductance than conventional thermal bumps. Consequently, the improved bump of FIG. 4 has improved electrical properties as well as improved thermal properties.

The present inventors have found significant improvement in heat-dissipation for tapered bumps having a wider portion which has a cross-sectional area that is 1.5 times or more greater than the cross-sectional area of the corresponding narrow portion. For instance, the inventors performed one test on a 3.3 mm transistor with 22 by 150 micron gate fingers and a 22 micron gate pitch. A 0.7 watt/mm power density was assumed. The peak temperature rise on a 100 micron thick GaAs MMIC which was conventionally-mounted on a copper heat sink was 96 degrees centigrade. The peak temperature rise when the same MMIC was flip mounted on a 25 mil thick silicon nitride substrate with a conventional 130 by 592 micrometer thermal bump was 78 degrees centigrade. Significantly, a "T" shaped bump having narrow portion dimensions of 130 by 592 micrometers and thicker portion dimensions of 208 by 592 micrometers reduced the peak temperature rise to only 68 degrees centigrade. It may be noted that the better-performing "T" shape bump had a cross-sectional area that was approximately 1.6 times greater at the substrate than at the MMIC.

Figure 5:
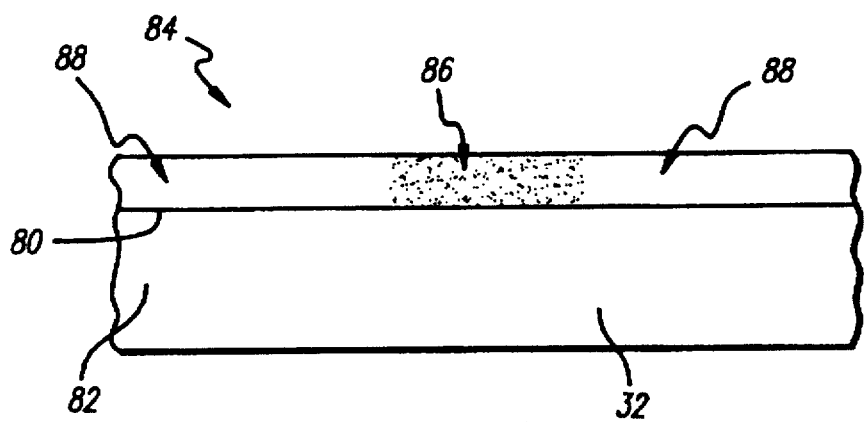
FIGS. 5–7 are simplified, partial sectional views showing certain steps of a manufacturing process for the present invention.
Figure 6:
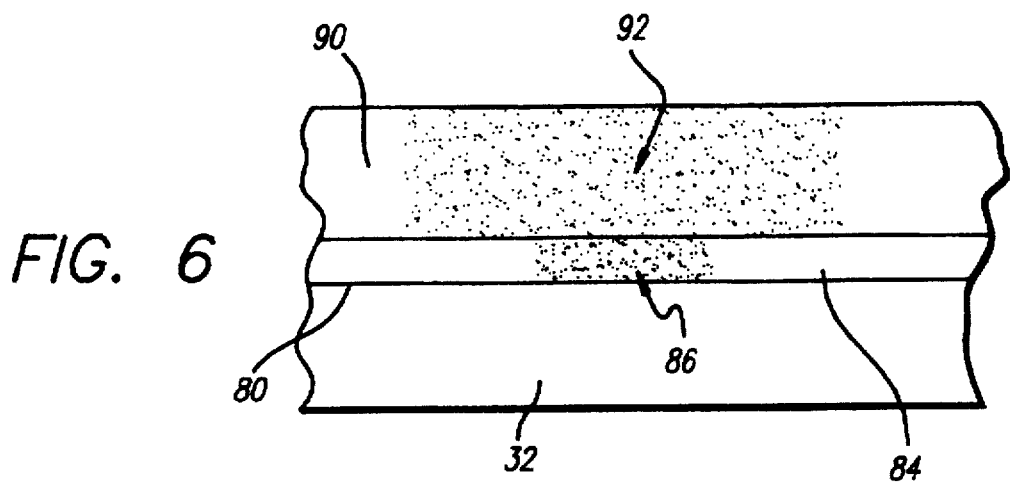
Figure 7:
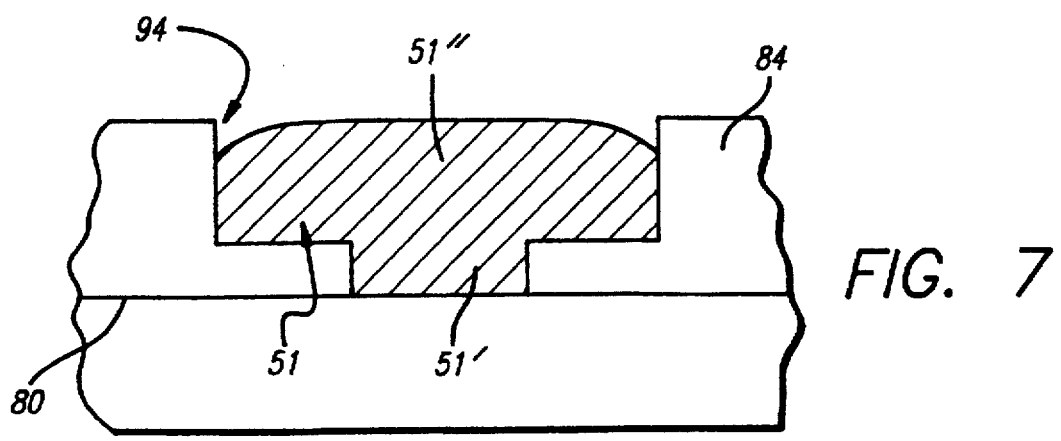

Although tapered or trapezoidal configuration bumps may be made by different procedures, it is presently preferred to fabricate a bump of the configuration shown in FIG. 4 by a multi-layer, multi-exposure negative photoresist process which is illustrated in FIGS. 5–7. A plating membrane 80 is first formed on the contact pad of the GaAs MMIC 82. The plating membrane 80 is typically an extremely thin layer of gold with a thickness of between approximately 2000 to 5000 angstroms. This plating membrane becomes a highly conductive electrode so that silver or other metal may be plated to the contact pad.

A first layer of negative photoresist 84 is then applied to the surface of the plating membrane 80. Methods of applying negative photoresist are well known in the art. In this case, the negative photoresist may be supplied in dry sheet form.

As the enlarged drawing of FIG. 5 shows, the first layer of negative photoresist 84 is then exposed to a first masked pattern of light. The mask leaves a first rectangular area 86 of the photoresist 84 unexposed, but allows the light to expose the remainder 88 of the first layer of photoresist.

A second layer of negative photoresist 90 is then applied on top of the first layer of photoresist 84, to at least fully cover the unexposed area 86 of the first layer. (FIG. 6). The second layer 90 of negative photoresist is then exposed to a second masked pattern of light. The second light field mask has larger darkened pattern areas and leaves a second rectangular unexposed area 92 of negative photoresist immediately on top of the unexposed area 86 of the first layer. As seen in FIG. 6, the second unexposed area 92 is wider than the first unexposed area 86 of photoresist. The superimposed first and second unexposed areas 86, 92 together form a "T" of unexposed photoresist.

The layers of photoresist 84 and 90 are then developed with a photoresist developer, and the unexposed "T" areas are removed, thereby leaving a substantially "T"-shaped via 94, which is also known as a void, where the unexposed "T" of photoresist had been. Methods of developing and removing photoresist are well-known in the art.

An electrically and thermally conductive metal such as silver is then electro-plated, or otherwise formed onto the plating membrane 80 and into the substantially "T"-shaped via 94 to form a substantially "T"-shaped thermal bump 51. As a final step, the surface of the wide portion of the "T" is conventionally soldered onto the host substrate with lead-indium solder.

It is to be understood that the foregoing detailed description and the accompanying drawings relate to preferred embodiments of the invention. Various changes and modifications may be made without departing from the spirit and scope of the invention. Thus, by way of example and not of limitation, the improved thermal bump may have any of a variety of different shapes. A four-sided, stepped pyramid shape may be constructed using three or more layers of photoresist. The embodiment of FIGS. 3 and 4 generally has a "T" profile along two of its sides, but has a constant-width profile when viewed from the two remaining sides. However, an improved bump having a "T" profile when viewed from all four sides may alternatively be constructed.

The bump of FIGS. 3 and 4 is also generally soldered directly to the host substrate. However, copper heat sink pads may be provided on the surface of the host substrate. The bumps may then be soldered to the heat sinks rather than directly onto the surface of the substrate.

The present invention is not limited to the materials discussed in connection with the preferred embodiments above. Consequently, any appropriate materials may be used for the MMIC, the thermal bump, and the host substrate. Additionally, the present invention is not limited to use with MMICs alone but may be employed to drain heat from a variety of integrated circuit modules.

Accordingly, it is to be understood that the detailed description and the accompanying drawings, as set forth hereinabove, are not intended to limit the breadth of the present invention, which should be inferred only from the following claims and their appropriately construed legal equivalence, rather than from the examples given.

What is claimed is:

1. A high power, flip-chip microwave monolithic integrated circuit (MMIC) comprising:

a high power microwave monolithic integrated circuit (MMIC) having a surface with an active area in which heat is generated during operation of the MMIC wherein said active area comprises a plurality of source pads, gate pads, drain pads and electrically-conductive air bridges, said air bridges extending over said gate pads and said drain pads, said source pads being interposed in between said air bridges;

a host substrate;

a thermally conductive bump formed as a separate structure from said air bridge and consisting essentially of silver for removing said heat from said active area of said MMIC, and formed over said surface and in direct contact with said air bridge, with a first portion in close proximity to and in thermal communication with the active area of the MMIC and a second portion which is in close proximity to and in thermal communication with said host substrate, said second portion having a greater cross-sectional area than said first portion whereby said thermally conductive bump conducts said heat from said active area of said MMIC to said substrate;

said bump being electrically conductive and being in electrical contact with said source pads and said air bridges, said gate pads and drain pads being separated from said air bridges by free air spaces, said gate pads and drain pads being free from electrical contact with said bump;

said host substrate being a common ground to said source pads.

2. A high power MMIC module as defined in claim 1, wherein said bump is substantially "T"-shaped having a cross-bar and a post, said cross-bar forming said second portion and said post forming said first portion.

3. A high power MMIC module as defined in claim 2, wherein said second portion has a cross-sectional area at said substrate that is at least approximately 1.5 times greater than the cross-sectional area of said first portion at said MMIC.

4. A high power MMIC module as defined in claim 1 wherein said second portion of said bump is soldered to said host substrate.

5. A high power MMIC module as defined in claim 1 wherein said bump is substantially a four-sided, stepped pyramid having a base comprising said second portion of said bump and a top narrower than said base and comprising said first portion of said bump, said base being in thermal communication with said substrate and said top being in thermal communication with said MMIC.

6. A high power, flip-chip microwave MMIC module as defined in claim 1, wherein said MMIC has a connection pad and said first portion of said bump is connected to said connection pad.

7. A high power, flip-chip MMIC module as defined in claim 1, wherein said module further comprises a thin gold plating membrane interposed in between said first portion of said bump and said MMIC.

* * * * *